United States Patent
Kim et al.

(10) Patent No.: US 10,794,960 B2
(45) Date of Patent: Oct. 6, 2020

(54) METHOD AND APPARATUS FOR DETECTING LOW VOLTAGE DEFECT OF SECONDARY BATTERY

(71) Applicant: LG CHEM, LTD., Seoul (KR)

(72) Inventors: Sung-Tae Kim, Daejeon (KR); Joon-Sung Bae, Daejeon (KR); Nak-Gi Sung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 239 days.

(21) Appl. No.: 16/078,532

(22) PCT Filed: Jan. 3, 2018

(86) PCT No.: PCT/KR2018/000135
§ 371 (c)(1),
(2) Date: Aug. 21, 2018

(87) PCT Pub. No.: WO2018/128395
PCT Pub. Date: Jul. 12, 2018

(65) Prior Publication Data
US 2019/0033380 A1     Jan. 31, 2019

(30) Foreign Application Priority Data
Jan. 5, 2017    (KR) .................... 10-2017-0002032

(51) Int. Cl.
*G01R 31/385*     (2019.01)
*H01M 10/42*      (2006.01)
(Continued)

(52) U.S. Cl.
CPC ......... *G01R 31/3865* (2019.01); *G01R 31/36* (2013.01); *G01R 31/388* (2019.01);
(Continued)

(58) Field of Classification Search
CPC .. G01R 31/36; G01R 31/3865; G01R 31/388; H01M 10/0404; H01M 10/0525; H01M 10/4285; H01M 10/446; H01M 10/48
See application file for complete search history.

(56) References Cited

U.S. PATENT DOCUMENTS 8,395,356 B2 *   3/2013   Schaefer ........... H01M 10/0525
                                                      320/134
8,586,237 B2 *  11/2013   Matsui ............... H01M 10/056
                                                      429/199
(Continued)

FOREIGN PATENT DOCUMENTS

CN    101950815 A    1/2011
CN    105609889 A    5/2016
(Continued)

OTHER PUBLICATIONS

International Search Report (PCT/ISA/210) issued in PCT/KR2018/000135, dated May 4, 2018.

*Primary Examiner* — Carl J Arbes
(74) *Attorney, Agent, or Firm* — Birch, Stewart, Kolasch & Birch, LLP

(57) ABSTRACT

Disclosed is a technique for effectively detecting a low voltage defect that may occur at a secondary battery. A method for detecting a low voltage defect of a secondary battery includes an assembling step of assembling a secondary battery by accommodating an electrode assembly, in which a positive electrode plate and a negative electrode plate are stacked with a separator being interposed therebetween, and an electrolytic solution in a battery case; a primary aging step of aging the assembled secondary battery at a temperature of 20° C. to 40° C.; a primary formation step of charging the aged secondary battery at a C-rate of 0.1 C to 0.5 C; a high-rate charging step of charging the secondary battery at a C-rate of 2 C or above, after the primary formation step; and a detecting step of detecting a defect of the secondary battery, after the high-rate charging step.

8 Claims, 5 Drawing Sheets

(51) Int. Cl.
  *G01R 31/388* (2019.01)
  *H01M 10/48* (2006.01)
  *H01M 10/44* (2006.01)
  *G01R 31/36* (2020.01)
  *H01M 10/0525* (2010.01)
  *H01M 10/04* (2006.01)

(52) U.S. Cl.
  CPC ... *H01M 10/0525* (2013.01); *H01M 10/4285* (2013.01); *H01M 10/446* (2013.01); *H01M 10/48* (2013.01); *H01M 10/0404* (2013.01)

(56) References Cited

U.S. PATENT DOCUMENTS

| | | | | |
|---|---|---|---|---|
| 9,590,439 | B2 * | 3/2017 | Hasegawa | B60L 58/16 |
| 2008/0224667 | A1 * | 9/2008 | Tanaka | H01M 10/425 |
| | | | | 320/139 |
| 2009/0121685 | A1 * | 5/2009 | Eto | H01M 10/486 |
| | | | | 320/152 |
| 2013/0187614 | A1 * | 7/2013 | Bhardwaj | H01M 10/443 |
| | | | | 320/134 |
| 2014/0310951 | A1 | 10/2014 | Grant et al. | |
| 2015/0255998 | A1 * | 9/2015 | Hasegawa | H02J 7/007 |
| | | | | 320/107 |
| 2016/0261006 | A1 | 9/2016 | Ueno et al. | |

FOREIGN PATENT DOCUMENTS

| | | | |
|---|---|---|---|
| DE | 10 2014 219 635 A1 | | 3/2016 |
| EP | 2 626 944 A1 | | 8/2013 |
| JP | 08-115747 A | * | 5/1996 |
| JP | 11-250930 A | | 9/1999 |
| JP | 2015-15084 A | | 1/2015 |
| JP | 2015-153484 A | | 8/2015 |
| KR | 10-1106359 B1 | | 1/2012 |

* cited by examiner

METHOD AND APPARATUS FOR DETECTING LOW VOLTAGE DEFECT OF SECONDARY BATTERY

TECHNICAL FIELD

The present application claims priority to Korean Patent Application No. 10-2017-0002032 filed on Jan. 5, 2017 in the Republic of Korea, the disclosures of which are incorporated herein by reference.

The present disclosure relates to a technique for inspecting a fault of a secondary battery, and more particularly, to a technique for effectively detecting a low voltage defect that may occur at a secondary battery.

BACKGROUND ART

Generally, a secondary battery refers to a battery capable of being charged and discharged, unlike a primary battery that is not capable of being charged, and the secondary battery is widely used in electric vehicles and electronic devices such as mobile phones, notebook computers and camcorders. In particular, a lithium secondary battery has a larger capacity than a nickel-cadmium battery or a nickel-hydrogen battery and has a high energy density per unit weight, so its utilization is rapidly increasing.

The lithium secondary battery mainly uses a lithium oxide and a carbonaceous material as a positive electrode active material and a negative electrode active material, respectively. The lithium secondary battery includes an electrode assembly having a positive electrode plate and a negative electrode plate respectively coated with the positive electrode active material and the negative electrode active material with a separator being interposed therebetween, and an exterior in which the electrode assembly is accommodated and sealed together with an electrolytic solution.

Meanwhile, the lithium secondary battery may be classified as a can-type secondary battery in which the electrode assembly is included in a metal can, and a pouch-type secondary battery in which the electrode assembly is included in a pouch made of aluminum laminate sheets, depending on the shape of the battery case.

The secondary battery is generally manufactured by injecting a liquid electrolyte, namely an electrolytic solution, in a state where the electrode assembly is accommodated in the battery case, and then sealing the battery case.

Various types of defects may occur at the lithium secondary battery due to various causes while the lithium secondary battery is being manufactured or in use. In particular, some secondary batteries that have been manufactured show a voltage drop behavior above a self-discharge rate, which is called low voltage defect.

The low voltage defect of such a secondary battery is often caused by a metallic foreign substance located therein. In particular, when there is a metallic foreign matter such as iron or copper on a positive electrode plate of the secondary battery, the metallic foreign matter may grow to dendrite on a negative electrode. In addition, the dendrite may cause an internal short circuit of the secondary battery, which may cause a failure or damage of the secondary battery, or in severe cases, an ignition.

So far, some techniques have been proposed to inspect low voltage defects of secondary batteries. However, there is a limit in effectively and rapidly detecting low voltage defects of the secondary batteries.

DISCLOSURE

Technical Problem

The present disclosure is designed to solve the problems of the related art, and therefore the present disclosure is directed to providing a method and apparatus for detecting a low voltage defect of a secondary battery with improved performance.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a method for detecting a low voltage defect of a secondary battery, comprising: an assembling step of assembling a secondary battery by accommodating an electrode assembly, in which a positive electrode plate and a negative electrode plate are stacked with a separator being interposed therebetween, and an electrolytic solution in a battery case; a primary aging step of aging the assembled secondary battery at a temperature of 20° C. to 40° C.; a primary formation step of charging the aged secondary battery at a C-rate of 0.1 C to 0.5 C; a high-rate charging step of charging the secondary battery at a C-rate of 2 C or above, after the primary formation step; and a detecting step of detecting a defect of the secondary battery, after the high-rate charging step.

Here, the high-rate charging step may be performed during 10 seconds to 20 seconds.

In addition, the high-rate charging step may be performed at a temperature of 20° C. to 40° C.

In addition, in the high-rate charging step, the secondary battery may be charged at a C-rate of 3 C or above.

In addition, the method for detecting a low voltage defect of a secondary battery according to the present disclosure may further comprise, after the primary formation step and before the high-rate charging step, a secondary aging step of aging the secondary battery at a temperature condition of 60° C. to 70° C. during 12 hours to 72 hours; and a secondary formation step of charging the secondarily aged secondary battery at a C-rate of 0.1 C to 2 C.

In addition, the high-rate charging step may be performed within 20 minutes to 120 minutes after the secondary formation step.

In addition, in the detecting step, after the high-rate charging step, a difference in OCV between two different points may be compared with a reference value to determine whether a defect occurs at the secondary battery.

In another aspect of the present disclosure, there is also provided an apparatus for detecting a low voltage defect of a secondary battery, comprising: an assembling unit configured to assemble a secondary battery by accommodating an electrode assembly, in which a positive electrode plate and a negative electrode plate are stacked with a separator being interposed therebetween, and an electrolytic solution in a battery case; a primary aging unit configured to age the secondary battery, assembled by the assembling unit, at a temperature of 20° C. to 40° C.; a primary formation unit configured to charge the secondary battery, aged by the primary aging unit, at a C-rate of 0.1 C to 0.5 C; a high-rate charging unit configured to charge the secondary battery at a C-rate of 2 C or above, after the secondary battery is charged by the primary formation unit; and a detecting unit configured to detect a defect of the secondary battery, after the secondary battery is charged by the high-rate charging unit.

Advantageous Effects

According to the present disclosure, it is possible to detect a low voltage defect of a secondary battery more quickly and more accurately.

In particular, according to an embodiment of the present disclosure, when a metallic foreign matter is included in a positive electrode, it is possible to accelerate the dendritic growth of the metallic foreign matter to increase a voltage drop rate compared to a normal cell, thereby improving the low voltage detection capability.

Moreover, according to an embodiment of the present disclosure, it is possible to detect a low voltage defect in a short time.

Therefore, according to the above embodiments of the present disclosure, it is possible to detect a secondary battery, which is likely to contain a metal foreign object and cause a low voltage defect, at an early stage to prevent any defective secondary battery from being distributed or used. Thus, it is possible to prevent the secondary battery from being damaged, failed or ignited due to a metallic foreign matter while the secondary battery is in use.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
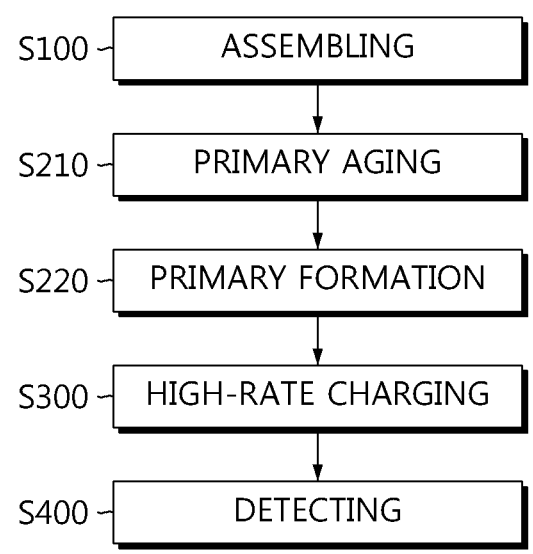
FIG. 1 is a schematic flowchart for illustrating a method for detecting a low voltage defect of a secondary battery according to an embodiment of the present disclosure.

FIG. 1 is a schematic flowchart for illustrating a method for detecting a low voltage defect of a secondary battery according to an embodiment of the present disclosure.

Referring to FIG. 1, the method for detecting a low voltage defect of a secondary battery according to the present disclosure may include an assembling step (S100), a primary aging step (S210), a primary formation step (S220), a high-rate charging step (S300) and a detecting step (S400).

In the assembling step (S100), a secondary battery is assembled using an electrode assembly, an electrolytic solution and a battery case.

Figure 2:
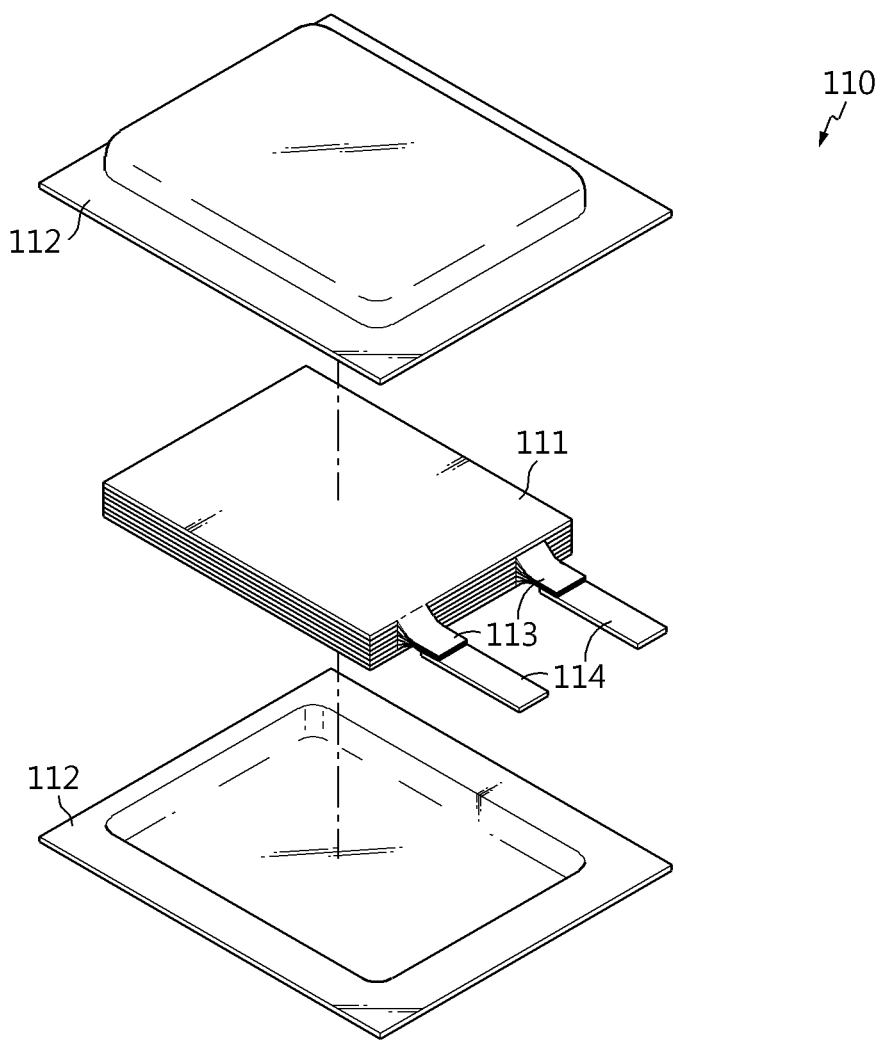
FIG. 2 is an exploded perspective view schematically showing a secondary battery assembled in the assembling step according to an embodiment of the present disclosure.
Figure 3:
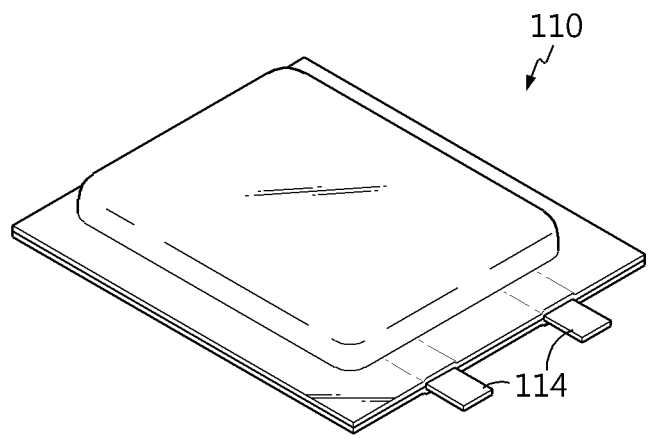
FIG. 3 is an assembled perspective view of FIG. 2.

FIG. 2 is an exploded perspective view schematically showing a secondary battery assembled in the assembling step according to an embodiment of the present disclosure, and FIG. 3 is an assembled perspective view of FIG. 2.

Referring to FIGS. 2 and 3, the secondary battery assembled in Step S100 may be configured so that the electrode assembly and the electrolytic solution are accommodated in the battery case.

Here, the electrode assembly 111 may be configured so that at least one positive electrode plate and at least one negative electrode plate are stacked with a separator being interposed therebetween. In addition, the electrode plates of the electrode assembly are formed by coating a current collector with active material slurry, and the slurry may be generally formed by stirring granular active material, an auxiliary conductor, a binder and a plasticizer in a state where a solvent is added thereto. In addition, each electrode plate may have an uncoated portion not coated with the slurry, and an electrode tab 113 corresponding to each electrode plate may be attached to the uncoated portion. In addition, one end of the electrode lead 114 may be attached and coupled to the electrode tab 113, and the other end of the electrode lead 114 may be exposed out of the battery case to serve as an electrode terminal that can be connected to an external device such as another secondary battery, a bus bar, a load and a charging device.

The electrolytic solution means a liquid electrolyte, which allows ions to move between the positive electrode plate and the negative electrode plate. In addition, the secondary battery may be charged and discharged by means of ion exchange between the positive electrode plate and the negative electrode plate. In lithium secondary batteries, non-aqueous electrolytic solutions are commonly used.

The electrolytic solution that is useable in the secondary battery is a salt of a A+B-structure, where A+ includes an ion selected from the group consisting of alkali metal cations such as Li+, Na+, K+, or combinations thereof, and B− is an anion such as $PF_6^-$, $BF_4^-$, $Cl^-$, $Br^-$, $I^-$, $ClO_4^-$, $AsF_6^-$, $CH_3CO_2^-$, $CF_3SO_3^-$, $N(CF_3SO_2)_2^-$, $C(CF_3SO_2)_3^-$, or a combination thereof. The salt may be dissolved or dissociated an organic solvent selected from the group consisting of propylene carbonate (PC), ethylene carbonate (EC), diethyl carbonate (DEC), dimethyl carbonate (DMC), dipropyl carbonate (DPC), dimethylsulfoxide, acetonitrile, dimethoxyethane, diethoxyethane, tetrahydrofuran, N-methyl-2-pyrrolidone (NMP), ethylmethyl carbonate (EMC), gammabutyrolactone (γ-butyrolactone), and mixtures thereof, without being limited thereto.

The battery case 112 has an inner space in which the electrode assembly and the electrolytic solution may be accommodated.

The battery case may be a pouch-type case in which a metal layer such as aluminum is interposed between polymer layers, and a can-type case having a cylindrical shape or an angled pillar shape made of a metal. In particular, the secondary battery to be inspected may be a pouch-type battery as shown in FIGS. 2 and 3. However, the present disclosure does not necessarily relate to only the pouch-type secondary battery.

Seeing the configuration of FIGS. 2 and 3, the pouch-type case has a concave inner space, and the electrode assembly and the electrolytic solution may be accommodated in the inner space. In addition, as shown in the figures, the pouch-type case is composed of an upper pouch and a lower pouch, and outer peripheries thereof are fused to each other to form a sealing portion so that the inner space is sealed.

The configuration of FIGS. 2 and 3 is just an example of the secondary battery, and the secondary battery manufactured in Step S100 of the present disclosure may also be configured in various other forms.

In the primary aging step S210, the secondary battery assembled in Step S100 is aged for a predetermined time. In the aging step, the manufactured secondary battery may be stored at a predetermined temperature.

In particular, in the primary aging step (S210), the secondary battery may be stored under a temperature condition of 20° C. to 40° C. For example, in the primary aging step (S210), the secondary battery may be stored in a chamber where the temperature condition keeps constant. Further, in the primary aging step (S210), the secondary battery may be stored under a temperature condition of 20° C. to 30° C.

In addition, the primary aging step (S210) may be performed for a predetermined time. In particular, the primary aging step may be performed for 24 hours to 72 hours. For example, the primary aging step may be performed for 30 hours at a temperature condition of 20° C.

As shown in the figures, the primary aging step (S210) may be performed immediately after the secondary battery is assembled. That is, the primary aging step may be performed immediately in a state where the electrode assembly and the electrolytic solution are accommodated in the battery case and the battery case is sealed, without any other process being performed.

The primary aging step (S210) may allow the electrolytic solution injected into the secondary battery in the assembling step (S100) to be well mixed, and may also allow the electrolytic solution to be spread well inside the battery. In particular, it is recommended that the separator is well impregnated with the electrolytic solution as a whole in order to facilitate easy ion exchange between the positive electrode plate and the negative electrode plate. In the primary aging step (S210), the separator may be easily impregnated with the electrolytic solution impregnation uniformly as a whole.

In the primary formation step S220, the secondary battery primarily aged in Step S210 is charged to a predetermined SOC.

Here, in the primary formation step (S220), the secondary battery may be charged to an SOC of 30% to 40%. In Step S220, if the SOC is too low, a solid electrolyte interphase (SEI) layer is not sufficiently generated, and thus a side reaction for additional formation for layer stabilization may occur even after the primary charging, which may cause degradation of the cell capacity. Meanwhile, in Step S220, if the secondary battery is charged to an excessively high SOC, the SEI layer formation reaction may be performed more than necessary to increase the irreversible capacity, thereby decreasing the cell capacity. Thus, it is recommended that the primary formation step is performed in the above SOC range. Alternatively, in the primary formation step (S220), the secondary battery may be charged for 90 minutes to 180 minutes.

Preferably, in the primary formation step (S220), the secondary battery may be charged at a C-rate of 0.1 C to 0.5 C. In particular, in Step S220, the secondary battery may be charged at a C-rate of 0.1 C to 0.2 C. For example, in the primary formation step, the secondary battery may be charged at a C-rate of 0.1 C.

In this configuration of the present disclosure, a dense and stable SEI layer may be formed. In particular, if the C-rate is too high, a polarization may be formed so that a strong charge is partially supplied, and gas is excessively generated due to excessive reaction, which may make it difficult to form a uniform SEI layer. Thus, the cycle performance of the secondary battery may be degraded. Further, even after the primary charging, a side reaction for forming the layer may continuously occur, which may adversely affect the cell performance. Meanwhile, if the C-rate is too low, the productivity may deteriorate.

The primary formation step (S220) may be performed under a temperature condition of 20° C. to 40° C. Moreover, the primary formation step (S220) may be performed under a temperature condition of 20° C. to 30° C.

In this configuration of the present disclosure, the SEI layer may be stably formed to improve battery performance. In particular, if the primary formation step is performed at too high temperature, the SEI layer may not be formed stably due to excessive gas generation, and an undesired side reaction such as decomposition of the electrolytic solution and the additive may occur. Thus, in this case, the performance of the secondary battery may deteriorate.

For example, in the primary formation step, the secondary battery may be charged to SOC 30% at a C-rate of 0.2 C at a temperature of 25° C.

In addition, in the primary formation step (S220), the secondary battery may be charged with a charging voltage of 3.4V to 3.7V. However, the charging voltage may vary depending on the type and characteristic of the secondary battery.

The primary formation step may stabilize the structure of the secondary battery and activate the secondary battery to come into an actually usable state.

In the high-rate charging step (S300), the secondary battery experiencing Step S220 is charged at a high C-rate. In particular, in the high-rate charging step (S300), the secondary battery may be charged at a C-rate of 2 C or above. Moreover, in the high-rate charging step (S300), the secondary battery may be charged at a C-rate of 3 C or above.

In this configuration of the present disclosure, the high-rate charging may accelerate the growth of dendrite of a metallic foreign matter. That is, in case of a secondary battery that is highly likely to cause a low voltage detect since a metallic foreign matter is included in the secondary battery, if the secondary battery is charged at the high C-rate as above, the metallic foreign matter may grow to a dendrite faster on the negative electrode plate. In addition, the voltage drop rate of the secondary battery may increase resultantly, thereby improving the low voltage defect detection capability.

Preferably, the high-rate charging step (S300) may be performed for a time of 10 seconds to 20 seconds. If the high-rate charging step (S300) is performed for a shorter time, dendrite growth may not be sufficiently performed from the metallic foreign matter. Meanwhile, if the high-rate charging step is performed for a longer time, the battery voltage may reach the upper limit due to overvoltage, and the high-rate charging time may be different for various batteries due to the contact state of the charging/discharging gripper and the lead or the difference in internal resistance of the batteries.

Also preferably, the high-rate charging step (S300) may be performed at a temperature condition of 20° C. to 40° C. For example, the high-rate charging step (S300) may be performed so that the secondary battery is charged at a high rate in a state of being exposed to room temperature. In this configuration of the present disclosure, the metallic foreign matter may be easily extracted from the negative electrode plate, without deforming or damaging the electrode plate, the separator or the electrolytic solution of the secondary battery.

In particular, in the high-rate charging step (S300), the secondary battery may be charged at a C-rate of 5 C or above. Moreover, in the high-rate charging step (S300), the secondary battery may be charged at a C-rate of 10 C or above, 15 C or above, or 20 C or above. In this configuration, the dendrite growth of the metallic foreign matter is more accelerated, thereby enabling faster and more accurate detection of a low voltage defect. If the high-rate charging is applied as above, it would be more advantageous in detecting a defect of the secondary battery. Moreover, during the high-rate charging, a low voltage may be more advantageously selected by means of dOCV dispersion. In particular, a low voltage defect may occur as a foreign matter is included in the electrode, and if the high-rate charging is applied, it is possible to more effectively figure out the presence of the foreign matter. In addition, as the C-rate is higher, the current density of the negative electrode may be increased to facilitate the extraction (reduction reaction) of metal ions. Also, as the level increases, acicular growth may be accelerated.

However, in the high-rate charging step (S300), the secondary battery may be charged at a C-rate of 20 C or below. If the secondary battery is charged at a higher C-rate than 20 C, Li ions may be extracted from the negative electrode, which may deteriorate the battery performance. Also, Step S300 may be performed at a C-rate of 10 C or below.

In the detecting step (S400), a defect of the secondary battery may be detected after the high-rate charging step (S300).

In particular, in the detecting step (S400), a defect of the secondary battery may be detected by using open circuit voltages (OCVs) measured at a plurality of different time points after the high-rate charging step (S300). For example, in the detecting step (S400), the secondary battery charged at a high rate in Step S300 is stored at room temperature, OCV is measured at least at two time points, and a difference value between the OCVs is compared with a reference value stored in a memory unit in advance, thereby checking the secondary battery has a defect.

More specifically, in the detecting step (S400), if the OCV difference is 8 mV and the reference value at the corresponding time is 6 mV, since the OCV difference is larger than the reference value, the secondary battery may be determined as having a low voltage defect.

As another example, in the detecting step (S400), the voltage (OCV) of the secondary battery may be measured periodically or non-periodically at several time points. In addition, in the detecting step (S400), a low voltage defect of the secondary battery may be determined by measuring a slope of the measured voltage of the secondary battery per unit time and comparing the measured voltage slope with a reference slope.

Meanwhile, in the detecting step (S400), the OCV of the secondary battery measured at a predetermined time may be used to determine whether the secondary battery has a low voltage defect. In order to measure the OCV, various OCV measurement techniques known in the art at the time of filing of this application may be employed.

As another example, in the detecting step (S400), a defect of the secondary battery may be detected by directly measuring a leakage current of the secondary battery. That is, in the detecting step (S400), after the secondary battery is charged at a high rate, while the secondary battery is being stored at room temperature, a potential may be applied to the electrode lead of the secondary battery to measure a current flowing therethrough. In this case, in the detecting step (S400), a battery having a large leakage current as compared with a normal battery may be selected as having a defect.

Figure 4:
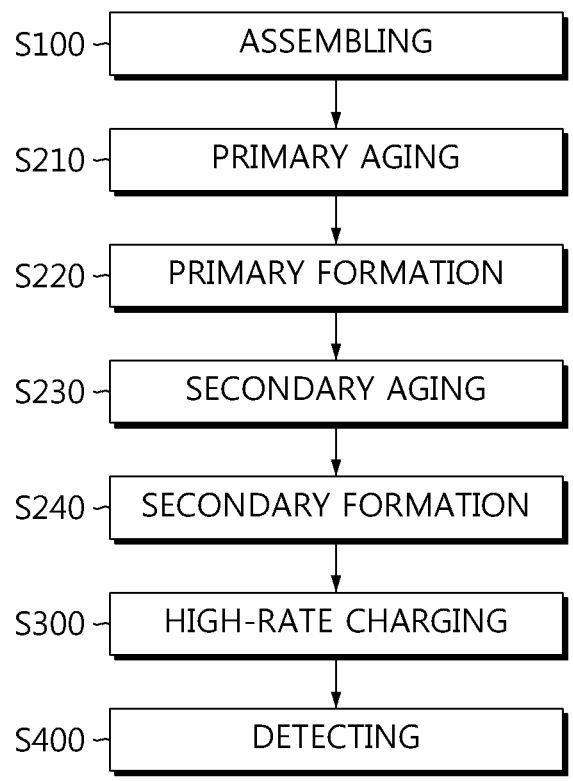
FIG. 4 is a schematic flowchart for illustrating a method for detecting a low voltage defect of a secondary battery according to another embodiment of the present disclosure.

FIG. 4 is a schematic flowchart for illustrating a method for detecting a low voltage defect of a secondary battery according to another embodiment of the present disclosure.

Referring to FIG. 4, the method may include an assembling step (S100), a primary aging step (S210), a primary formation step (S220), a secondary aging step (S230), a secondary formation step (S240), a high-rate charging step (S300) and a detecting step (S400). If the configuration of FIG. 4 is compared with the configuration of FIG. 1, Steps S100, S210, S220, S300 and S400 are common, and Steps S230 and S240 are further added between Steps S220 and S300. Thus, the common steps are not explained in detail, and only the steps having distinctive features will be explained in detail.

In the secondary aging step (S230), the secondary battery experiencing the primary formation in Step S220 is aged at a predetermined temperature for a predetermined time.

In the secondary aging step (S230), the secondary battery may be stored at a temperature condition of 60° C. to 70° C.

In addition, in the secondary aging step (S230), the secondary battery may be stored for 12 hours to 72 hours at a predetermined temperature condition.

According to the secondary aging, a portion of the electrode assembly that has insufficient wetting of the electrolytic solution may be additionally wetted, the SEI layer may be stabilized, and a metallic foreign matter not yet dissolved may be oxidized.

In the secondary formation step (S240), the secondary battery secondarily aged in Step S230 is charged.

Here, in the secondary formation step (S240), the secondary battery may be charged at a C-rate of 0.1 C to 2 C.

In addition, the secondary formation step (S240) may be performed until the secondary battery is fully charged, namely until the SOC of the secondary battery becomes 100%.

In addition, in the secondary formation step (S240), the secondary battery may be charged at a temperature condition of 20° C. to 40° C.

In addition, in the secondary formation step (S240), the secondary battery may be further discharged. For example, in the secondary formation step (S240), after the secondary battery is fully charged so that the SOC becomes 100%, the secondary battery may be fully discharged again so that the SOC becomes 0%. In addition, in the secondary formation step (S240), the secondary battery may be charged and/or discharged two times or more.

According to the secondary formation, it is easy to measure the performance of the secondary battery, the metallic foreign matter may be additionally oxidized, reduced and grown, and the SEI layer may be stabilized.

In this configuration, the high-rate charging step (S300) may be performed after the secondary formation step (S240).

In particular, in this case, the high-rate charging step (S300) is preferably performed within 20 minutes to 120 minutes after the secondary formation step (S240). In particular, it is recommended that Step S300 is performed within 60 minutes after Step S240.

The method for detecting a low voltage defect of a secondary battery according to the present disclosure may further include a degassing step.

In the degassing step, the gas generated inside the secondary battery is removed. In particular, during the aging step or the formation step, gas may be generated inside the secondary battery. In the degassing step, the gas generated inside the secondary battery and present in the secondary battery is removed from the inside of the secondary battery to the outside. In particular, the degassing step may be performed after the secondary aging step (S230) and before the secondary formation step (S240).

The degassing step may employ various degassing techniques known in the art at the time of filing of this application. For example, in a pouch-type secondary battery having one side elongated, the degassing step may be performed by cutting the elongated portion and then sealing the cut portion. However, the degassing technique is well known to those skilled in the art and thus will not be described in detail.

Figure 5:
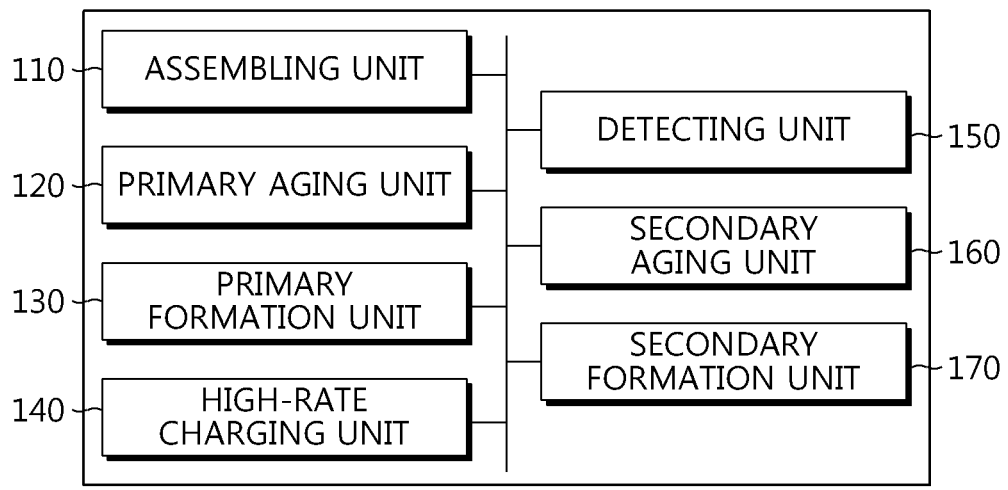
FIG. 5 is a block diagram schematically showing a functional configuration of an apparatus for detecting a low voltage defect of a secondary battery according to an embodiment of the present disclosure.

FIG. 5 is a block diagram schematically showing a functional configuration of an apparatus for detecting a low voltage defect of a secondary battery according to an embodiment of the present disclosure. The apparatus for detecting a low voltage defect of a secondary battery may perform the method for detecting a low voltage defect of a secondary battery, explained above.

Referring to FIG. 5, the apparatus for detecting a low voltage defect of a secondary battery according to the present disclosure may include an assembling unit 110, a primary aging unit 120, a primary formation unit 130, a high-rate charging unit 140 and a detecting unit 150.

The assembling unit may assemble a secondary battery. Here, the secondary battery may include an electrode assembly and an electrolytic solution. In addition, as shown in FIGS. 2 and 3, the electrode assembly may be accommodated in a battery case together with the electrolytic solution. In addition, the battery case may be sealed in a state where the electrode assembly and the electrolytic solution are accommodated therein. Here, the electrode assembly may be configured by stacking a positive electrode plate and a negative electrode plate with a separator being interposed therebetween. As described above, the assembling unit may be configured to perform the assembling step (S100) of the former embodiment depicted in FIGS. 1 to 4.

For this, the assembling unit may include an electrode assembly stacking part for stacking the positive electrode plate, the negative electrode plate and the separator, an electrolytic solution injecting part for injecting the electrolytic solution into the battery case, a thermal fusing part for thermally fusing the battery case to be sealed, and the like. Various battery assembling techniques known in the at the time of filing of this application can be employed for assembling a secondary battery, and this will not be described in detail here.

The primary aging unit may age the secondary battery assembled by the assembling unit. In particular, the primary aging unit may be configured to perform the primary aging step (S210) of the former embodiment depicted in FIGS. 1 and 4. For example, the primary aging unit may be configured to store the secondary battery for 24 hours to 72 hours at a temperature condition of 20° C. to 40° C. For this, the primary aging unit may include a chamber having a hollow space therein and capable of maintaining an internal temperature within a predetermined range.

The primary formation unit may charge the secondary battery primarily aged by the primary aging unit. In particular, the primary formation unit may be configured to perform the primary formation step (S220) of the former embodiment depicted in FIGS. 1 and 4. For example, the primary formation unit may be configured to charge the secondary battery at a C-rate of 0.1 C to 0.5 C. In addition, the primary formation unit may also be configured to charge the secondary battery until the SOC becomes 30% to 40%. Alternatively, the primary formation unit may be configured to charge the secondary battery for 90 minutes to 180 minutes. In addition, the primary formation unit may also be configured to charge the secondary battery at a temperature condition of 20° C. to 40° C. For this, the primary formation unit may include a power generator for generating power to be supplied to the secondary battery, a connection terminal configured to contact the electrode lead of the secondary battery to transmit the power supplied from the power generator to the secondary battery, and the like.

The high-rate charging unit may charge the secondary battery formed by the primary formation unit at a C-rate of 2 C or above. Moreover, the high-rate charging unit may charge the secondary battery at a C-rate of 3 C or above. In particular, the primary formation unit may be configured to perform the high-rate charging step (S300) in the former embodiment depicted in FIGS. 1 and 4.

The high-rate charging unit may be configured to charge the secondary battery for 10 seconds to 20 seconds.

In addition, the high-rate charging unit may be configured to charge the secondary battery at a temperature condition of 20° C. to 40° C.

In addition, the high-rate charging unit may be configured to charge the secondary battery at a C-rate of 5 C or above. Moreover, the high-rate charging unit may be configured to charge the secondary battery at a C-rate of 10 C or above, or at a C-rate of 15 C or above.

Since the high-rate charging unit charges the secondary battery, the high-rate charging unit may include a power generator for generating power to be supplied to the secondary battery, a connection terminal formed to contact the electrode lead of the secondary battery to transmit the power supplied from the power generator to the secondary battery, and the like, similar to the primary formation unit.

The detecting unit may detect a defect of the secondary battery charged by the high-rate charging unit. In particular, the detecting unit may be configured to perform the detecting step (S400) of the former embodiment depicted in FIGS. 1 and 4.

In particular, the detecting unit may determine whether the secondary battery has a defect by comparing a difference of two or more OCV values measured at different time points with a reference value, for the secondary battery charged at a high rate by the high-rate charging unit.

In addition, the apparatus for detecting a low voltage defect of a secondary battery according to the present disclosure may further include a secondary aging unit 160 and a secondary formation unit 170.

The secondary aging unit may age the secondary battery formed by the primary formation unit. In particular, the secondary aging unit may be configured to perform the secondary aging step (S230) of the former embodiment depicted in FIG. 4. For example, the secondary aging unit may be configured to store the secondary battery for 12 hours to 72 hours at a temperature condition of 60° C. to 70° C. For this configuration, the secondary aging unit may include a chamber having a hollow space therein and capable of maintaining an internal temperature within a predetermined range.

The secondary formation unit may form the secondary battery secondarily aged by the secondary aging unit. In particular, the secondary formation unit may be configured to perform the secondary formation step (S240) of the former embodiment depicted in FIG. 4. For example, the secondary formation unit may be configured to charge the secondarily aged secondary battery to the SOC of 0% to 100% at a C-rate of 0.1 C to 2 C. In addition, the secondary formation unit may be configured to charge the secondarily aged secondary battery at a temperature condition of 20° C. to 40° C. In addition, the secondary formation unit may also be configured to discharge the secondary battery. Moreover, the secondary formation unit may also be configured to charge and/or discharge the secondary battery two times or more. For this configuration, the secondary formation unit may include a power generator for generating a power to be supplied to the secondary battery, a connection terminal configured to contact the electrode lead of the secondary battery to transmit the power supplied from the power generator to the secondary battery, and the like. In addition, the secondary formation unit may further include a load or the like for receiving and consuming the power supplied from the secondary battery.

Meanwhile, at least some of the components employed at the apparatus for detecting a low voltage defect of a secondary battery according to the present disclosure may be commonly used. For example, the primary aging unit and the secondary aging unit may be implemented as a single common component. That is, one aging unit may be configured to function as both the primary aging unit and the secondary aging unit. In addition, at least two of the primary formation unit, the high-rate charging unit and the secondary formation unit may be implemented as one common component. For example, one charging unit may be configured to function as all of the primary formation unit, the high-rate charging unit and the secondary formation unit.

According to this configuration of the present disclosure, the apparatus for detecting a low voltage defect may have a simplified structure and a reduced volume. Further, in this case, the inspection process may be facilitated and the inspection time may be shortened.

Hereinafter, the present invention will be explained in detail with reference to embodiments. The embodiments of the present invention, however, may take several other forms, and the scope of the invention should not be construed as being limited to the following examples. The embodiments of the present invention are provided to more fully explain the present invention to those having ordinary knowledge in the art to which the present invention pertains.

A plurality of secondary batteries were manufactured in the same manner as explained below. First, a positive electrode plate was fabricated by using aluminum current collector and $LiNiMnCoO_2$ as a positive electrode material, and a negative electrode plate was fabricated by using a copper current collector and graphite as a negative electrode material. In addition, a positive electrode plate and a negative electrode plate were stacked with a separator being interposed therebetween, and then accommodated in a pouch exterior together with an electrolytic solution. At this time, $LiPF_6$ 1.0M and EC/EMC were used as the electrolytic solution. A plurality of secondary batteries configured as above were manufactured. At this time, for some secondary batteries, a single annular SUS304 piece with an average particle size of 100 um was inserted between the positive electrode plate and the separator as a metallic foreign matter.

The secondary batteries prepared as above were respectively subjected to primary aging for being stored at 25° C. for 72 hours, primary formation for being charged at 0.1 C for 180 minutes, secondary aging for being stored at 60° C. for 72 hours, degassing for removing gas from the inside of each secondary battery, and secondary formation for full charging (4.2V) and full discharge (3.0V) at 0.7 C.

Next, the plurality of secondary batteries were divided into four groups. Each group included a plurality of batteries having a metallic foreign matter and a plurality of batteries having no metallic foreign matter, and the secondary batteries of each group were charged for 10 seconds at the following C-rate.

Figure 6:
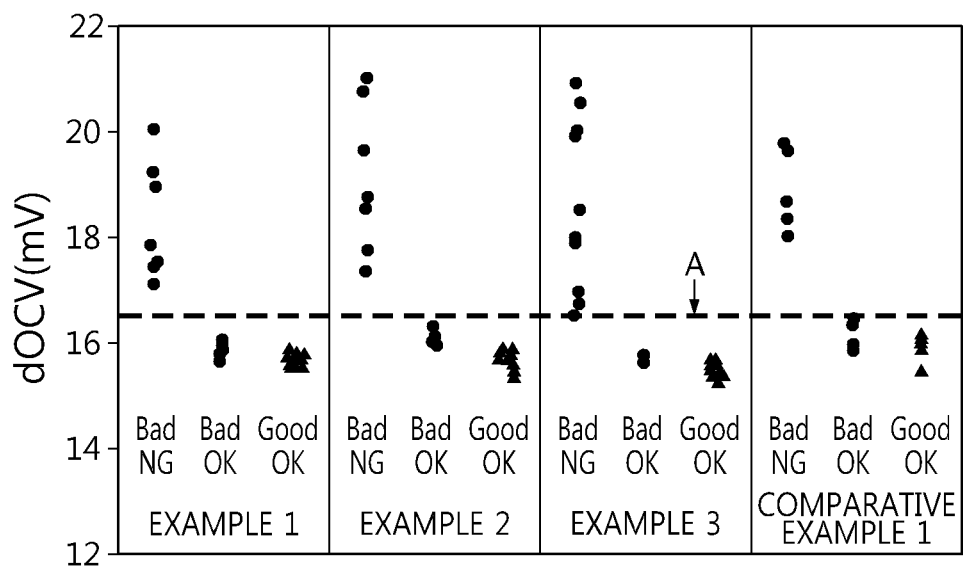
FIG. 6 is a graph showing a measurement result of a voltage drop (dOCV) by a low voltage defect inspection method according to various examples of the present disclosure and a comparative example.

Example Group 1: 3 C
Example Group 2: 4 C
Example Group 3: 10 C
Comparative Example Group 1: 0 C After that, a voltage of each secondary battery was monitored for 50 days. The measurement results of a voltage drop (dOCV) for 50 days are shown in FIG. 6. That is, FIG. 6 is a graph showing a measurement result of a voltage drop (dOCV) by a low voltage defect inspection method according to various examples of the present disclosure and a comparative example, and FIG. 7 is a graph showing a partial region of FIG. 6, which is enlarged in a y-axis direction.

Figure 7:
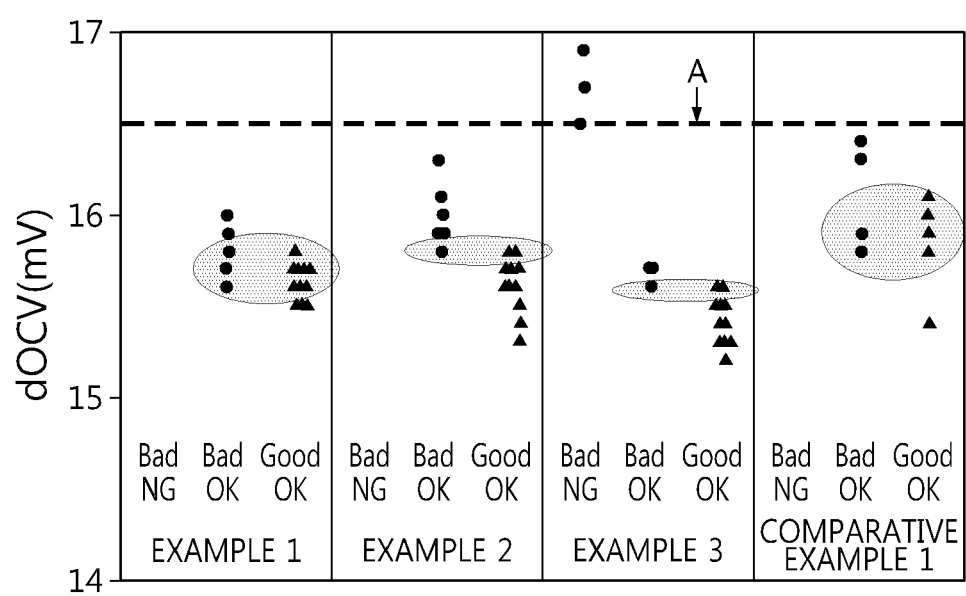
FIG. 7 is a graph showing a partial region of FIG. 6, which is enlarged in a y-axis direction.

In FIGS. 6 and 7, the measure results of the voltage drop of the battery with a metallic foreign matter are shown with circular points, and the measurement results of the voltage drop of the battery without a metallic foreign matter are shown with triangular points. In addition, in FIGS. 6 and 7, a dotted line A is a reference value for the voltage drop (dOCV) and may be regarded as a reference value for determining whether a low voltage defect occurs.

Thus, in FIG. 6, in case of a battery measured to have dOCV higher than the dotted line A may be regarded as a battery at which a low voltage defect obviously occurs. In the figures, such a battery is distinguishably marked as 'Bad NG'.

Meanwhile, even though a battery includes a metal foreign matter, the voltage drop may not be distinguished using the reference value since a low voltage defect does not occur obviously. That is, in FIG. 6, in some batteries having a metallic foreign matter, dOCV may be shown lower than the dotted line A. Such batteries can be regarded as batteries at which a low voltage does not occur obviously, and they are distinguishably marked as 'Bad OK' in the figures.

In addition, in case of a battery without a metallic foreign matter, since a low voltage does not occur, dOCV is lower than the dotted line A. Such a battery is distinguishably marked as 'Good OK'.

In FIG. 6, it may be found that all the batteries marked as 'Bad NG' have a metallic foreign matter put therein during the manufacturing process. In other words, it may be understood that the batteries having a metallic foreign matter put between the positive electrode plate and the separator during the manufacturing process shows a low voltage defect since the metallic foreign matter grows during the aging, charging and discharging processes, and thus the voltage drop rate is high.

In particular, it may be found that in the Example Groups 1 to 3, the proportion of secondary batteries measured as having a dOCV value higher than the dotted line A is greater, compared to the secondary batteries in Comparative Example Group 1. Thus, it may be understood that a low voltage defect can be more surely caused by the metallic foreign matter when the high-rate charging is performed after the formation as in the present disclosure. Therefore, according to the present disclosure, the possibility of a low voltage defect, caused by including a metallic foreign matter in the electrode, may be determined more quickly and more accurately.

Further, it may be found that in Example Group 3, the proportion of secondary batteries measured as having dOCV higher than the dotted line A is much higher, compared to the secondary batteries in Comparative Example Group 1 as well as the secondary batteries in Example Groups 1 and 2. That is, in each example group and comparative example group, the proportion of secondary batteries having dOCV value higher than the reference value A among all batteries having a metallic foreign matter is higher in Example Groups 1 to 3, compared to Comparative Example Group 1, and among Example Groups 1 to 3, higher in Example 2 in comparison to Example 1 and higher in Example 3 in comparison to Example 2.

Thus, according to the measurement results of the present disclosure, it may be understood that as the C-rate of the high-rate charging step gradually increases to 3 C, 4 C and 10 C, the performance for distinguishing a low voltage defect is further improved.

Moreover, in the method for detecting a low voltage defect according to the present disclosure, it may also be possible to effectively distinguish a low voltage defect based on whether a metal foreign matter is included in a secondary battery even though the secondary battery has dOCV lower than the reference value.

That is, referring to the graph of FIG. 7, which enlarges a partial region of FIG. 6, as the secondary batteries having dOCV lower than the reference value A, secondary batteries (Bad OK) to which a metallic foreign matter is put during the manufacturing process are found along with secondary batteries (Good OK) to which a metallic foreign matter is not put during the manufacturing process. In addition, in the secondary batteries with a metallic foreign matter and the secondary batteries without a metallic foreign matter, a portion where dOCV is overlapped is shaded.

In the graph of FIG. 7, seeing the measurement results of Comparative Example Group 1, dOCV regions of the secondary batteries with no metallic foreign matter and the secondary batteries with a metallic foreign matter are mostly overlapped, and thus it is difficult to distinguish whether a metallic foreign matter is put, just from the measurement result of dOCV.

However seeing the measurement results of Example Group 1, it may be found that the dOCV overlap region of the secondary battery with a metallic foreign matter and the secondary batteries with no metallic foreign matter is decreased, compared to Comparative Example Group 1. Seeing the measurement results, it is possible to determine whether or not a metallic foreign matter is put, for the secondary batteries whose dOCV is not overlapped.

Moreover, seeing the measurement results of Example Group 2 in which the C-rate of the high-rate charging step is increased in comparison to Example Group 1, it may be found that the dOCV overlap region is greatly reduced, compared with Example Group 1 as well as Comparative Example Group 1. Thus, it may be understood that the batteries with a foreign matter and the batteries without a foreign matter can be distinguished more easily, compared to Comparative Example Group 1 and Example Group 1.

Further, seeing the measurement results of Example 3 in which the C-rate of the high-rate charging step is further increased, it may be found that the dOCV overlap region is further reduced. Thus, in this case, it may be understood that whether a foreign matter is put can be distinguished more reliably.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

110: assembling unit
120: primary aging unit
130: primary formation unit
140: high-rate charging unit
150: detecting unit
160: secondary aging unit
170: secondary formation unit

What is claimed is:

1. A method for detecting a low voltage defect of a secondary battery, comprising:
    an assembling step of assembling a secondary battery by accommodating an electrode assembly, in which a positive electrode plate and a negative electrode plate are stacked with a separator being interposed therebetween, and an electrolytic solution in a battery case;
    a primary aging step of aging the assembled secondary battery at a temperature of 20° C. to 40° C.;
    a primary formation step of charging the aged secondary battery at a C-rate of 0.1 C to 0.5 C;
    a high-rate charging step of charging the secondary battery at a C-rate of 2 C or above, after the primary formation step; and
    a detecting step of detecting a defect of the secondary battery, after the high-rate charging step.

2. The method for detecting a low voltage defect of a secondary battery according to claim 1,
    wherein the high-rate charging step is performed during 10 seconds to 20 seconds.

3. The method for detecting a low voltage defect of a secondary battery according to claim 1,
    wherein the high-rate charging step is performed at a temperature of 20° C. to 40° C.

4. The method for detecting a low voltage defect of a secondary battery according to claim 1,
    wherein in the high-rate charging step, the secondary battery is charged at a C-rate of 3 C or above.

5. The method for detecting a low voltage defect of a secondary battery according to claim 1, after the primary formation step and before the high-rate charging step, further comprising:

a secondary aging step of aging the secondary battery at a temperature condition of 60° C. to 70° C. during 12 hours to 72 hours; and a secondary formation step of charging the secondarily aged secondary battery at a C-rate of 0.1 C to 2 C.

6. The method for detecting a low voltage defect of a secondary battery according to claim 5, wherein the high-rate charging step is performed within 20 minutes to 120 minutes after the secondary formation step.

7. The method for detecting a low voltage defect of a secondary battery according to claim 1, wherein in the detecting step, after the high-rate charging step, a difference in OCV between two different time points is compared with a reference value to determine whether a defect occurs at the secondary battery.

8. An apparatus for detecting a low voltage defect of a secondary battery, comprising:

an assembling unit configured to assemble a secondary battery by accommodating an electrode assembly, in which a positive electrode plate and a negative electrode plate are stacked with a separator being interposed therebetween, and an electrolytic solution in a battery case;

a primary aging unit configured to age the secondary battery, assembled by the assembling unit, at a temperature of 20° C. to 40° C.;

a primary formation unit configured to charge the secondary battery, aged by the primary aging unit, at a C-rate of 0.1 C to 0.5 C;

a high-rate charging unit configured to charge the secondary battery at a C-rate of 2 C or above, after the secondary battery is charged by the primary formation unit; and a detecting unit configured to detect a defect of the secondary battery, after the secondary battery is charged by the high-rate charging unit.

* * * * *